(12) United States Patent
Forrest

(10) Patent No.: US 12,185,619 B2
(45) Date of Patent: *Dec. 31, 2024

(54) SYSTEM AND METHOD FOR ORGANIC ELECTRONIC DEVICE PATTERNING

(71) Applicant: The Regents of the University of Michigan, Ann Arbor, MI (US)

(72) Inventor: Stephen R. Forrest, Ann Arbor, MI (US)

(73) Assignee: The Regents of the University of Michigan

( * ) Notice: Subject to any disclaimer, the term of this patent is extended or adjusted under 35 U.S.C. 154(b) by 0 days.

This patent is subject to a terminal disclaimer.

(21) Appl. No.: 18/491,050

(22) Filed: Oct. 20, 2023

(65) Prior Publication Data

US 2024/0049584 A1 Feb. 8, 2024

Related U.S. Application Data

(63) Continuation of application No. 17/100,003, filed on Nov. 20, 2020, now Pat. No. 11,832,504.

(Continued)

(51) Int. Cl.
*H10K 59/122* (2023.01)
*H10K 71/16* (2023.01)

(52) U.S. Cl.
CPC ......... *H10K 71/166* (2023.02); *H10K 59/122* (2023.02)

(58) Field of Classification Search
CPC ......... H10K 59/122; H10K 59/35–353; H10K 71/166

See application file for complete search history.

(56) References Cited

U.S. PATENT DOCUMENTS

| 4,769,292 A | 9/1988 | Tang |
|---|---|---|
| 5,247,190 A | 9/1993 | Friend |

(Continued)

FOREIGN PATENT DOCUMENTS

| EP | 1238981 | 9/2002 |
|---|---|---|
| JP | 2010135467 | 6/2010 |

(Continued)

OTHER PUBLICATIONS

Baldo et al., "Highly Efficient Phosphorescent Emission from Organic Electroluminescent Devices," Nature, vol. 395, pp. 151-154 (1998).

(Continued)

*Primary Examiner* — Daniel P Shook
(74) *Attorney, Agent, or Firm* — Riverside Law LLP

(57) ABSTRACT

A method for fabricating an organic electronic device comprises providing a plurality of photoresist structures on a substrate, the substrate having a first electrode layer, the photoresist structures having a bottom surface attached to the substrate and a top surface opposite the bottom surface, the top surface having a dimension greater than a dimension of the bottom surface, positioning a mask over the structures, the mask having a plurality of openings, and depositing an emissive material over the substrate through at least one of the plurality of openings to form at least one emissive element. An organic electronic device and a method of fabricating an organic electronic component are also described.

17 Claims, 6 Drawing Sheets

Related U.S. Application Data

(60) Provisional application No. 62/939,948, filed on Nov. 25, 2019.

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 5,953,587 A | 9/1999 | Forrest |
| 6,013,538 A | 1/2000 | Burrows |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,297,516 B1 | 10/2001 | Forrest |
| 6,303,238 B1 | 10/2001 | Thompson |
| 6,306,559 B1 | 10/2001 | Tanamura |
| 6,337,102 B1 | 1/2002 | Forrest |
| 6,468,819 B1 | 10/2002 | Kim |
| 7,279,704 B2 | 10/2007 | Walters |
| 7,431,968 B1 | 10/2008 | Shtein |
| 7,968,146 B2 | 6/2011 | Wagner |
| 10,608,188 B2 | 3/2020 | Lin |
| 11,832,504 B2 * | 11/2023 | Forrest ................ H10K 59/122 |
| 2003/0230980 A1 | 12/2003 | Forrest |
| 2004/0174116 A1 | 9/2004 | Lu |
| 2013/0026452 A1 | 1/2013 | Kottas |
| 2013/0119354 A1 | 5/2013 | Ma |
| 2015/0171150 A1 | 6/2015 | Ha |

FOREIGN PATENT DOCUMENTS

| | | |
|---|---|---|
| WO | 2004111066 A1 | 12/2004 |
| WO | 2008044723 | 4/2008 |
| WO | 2008057394 A1 | 5/2008 |
| WO | 2010011390 A2 | 1/2010 |
| WO | 2010111175 | 9/2010 |

OTHER PUBLICATIONS

Baldo et al., "Very High-Efficiency Green Organic Light-Emitting Devices Based on Electrophosphorescence," Appl. Phys. Lett., vol. 75, No. 1, pp. 4-6 (1999).

Office Action (Final Rejection) dated May 4, 2023 for U.S. Appl. No. 17/100,003 (pp. 1-8).

Office Action (Non-Final Rejection) dated Jan. 26, 2023 for U.S. Appl. No. 17/100,003 (pp. 1-5).

Office Action (Notice of Allowance and Fees Due (PTOL-85)) dated Jul. 20, 2023 for U.S. Appl. No. 17/100,003 (pp. 1-7).

Office Action (Notice of Allowance and Fees Due (PTOL-85)) dated Jul. 31, 2023 for U.S. Appl. No. 17/100,003 (pp. 1-4).

* cited by examiner

SYSTEM AND METHOD FOR ORGANIC ELECTRONIC DEVICE PATTERNING

CROSS-REFERENCE TO RELATED APPLICATIONS

This application is a Continuation application of U.S. patent application Ser. No. 17/100,003, filed Nov. 20, 2020, which is entitled to priority of U.S. Provisional Patent Application No. 62/939,948, filed Nov. 25, 2019, the disclosures of which are each incorporated herein by reference in their entirety.

STATEMENT REGARDING FEDERALLY SPONSORED RESEARCH OR DEVELOPMENT

This invention was made with government support under DE-SC0017971 and DE-EE0008723 awarded by the U.S. Department of Energy, and FA9550-18-1-0162 awarded by the United States Air Force Office of Scientific Research. The government has certain rights in the invention.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety. One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

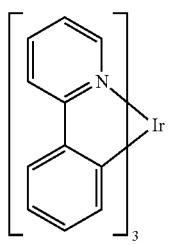

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, on a conventional energy level diagram, with the vacuum level at the top, a "shallower" energy level appears higher, or closer to the top, of such a diagram than a "deeper" energy level, which appears lower, or closer to the bottom.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

The greatest impediment to realizing low cost full color OLED displays today at high yield and resolution is the ability to pattern the side-by-side color elements. All existing forms of patterning such as inkjet and organic vapor jet printing and fine metal masks have proven to have significant problems in yield and resolution. Some existing methods include deposition of red, green, and blue layers, followed by etching away unwanted layers. Such methods require exposing organic materials to etchant, which can cause unnecessary damage to the device in addition to adding expense to the process.

SUMMARY OF THE INVENTION

In one aspect, a method for fabricating an organic electronic device comprises providing a plurality of photoresist structures on a substrate, the substrate having a first electrode layer, the photoresist structures having a bottom surface attached to the substrate and a top surface opposite the bottom surface, the top surface having a dimension greater than a dimension of the bottom surface, positioning a mask over the structures, the mask having a plurality of openings, and depositing an emissive material over the substrate through at least one of the plurality of openings to form at least one emissive element. In one embodiment, the method further comprises removing the mask, and depositing a second electrode layer over the emissive element. In one embodiment, the first electrode layer is an anode and the second electrode layer is a cathode.

In one embodiment, the method further comprises depositing an anode injection or hole transport layer over the substrate prior to positioning the mask over the structures. In one embodiment, the method further comprises moving the mask to a second position after depositing the emissive material, and depositing a second emissive material over the substrate through at least one of the plurality of openings to form at least one second emissive element. In one embodiment, the second emissive material is different from the first emissive material. In one embodiment, the method further comprises moving the mask to a third position after depositing the emissive material, and depositing a third emissive material different from the first and second emissive materials over the substrate through at least one of the plurality of openings to form at least one third emissive element. In one embodiment, the first, second and third emissive elements are a red, a green, and a blue emissive element.

In one embodiment, the method further comprises removing the mask and positioning a second mask having a second plurality of openings over the structures, the second mask being different from the first mask, and depositing a second emissive material over the substrate through at least one of the plurality of openings to form at least one second emissive element. In one embodiment, the photoresist structures have an inverted pyramid shape. In one embodiment, the substrate is configured to have a plurality of subpixels, and the mask is configured with openings positioned at every third subpixel. In one embodiment, the method further comprises depositing an encapsulation layer over the second electrode layer. In one embodiment, the first electrode layer is directly electrically connected to all of the at least one emissive elements on the substrate.

In one embodiment, the second electrode layer is directly electrically connected to all of the at least one emissive elements on the substrate. In one embodiment, the first electrode layer is transparent. In one embodiment, the second electrode layer is transparent. In one embodiment, the method further comprises patterning the plurality of photoresist structures on the substrate. In one embodiment, an OLED display fabricated by the recited methods is disclosed.

In another aspect, an organic electronic device comprises a substrate, a first electrode layer positioned over the substrate; a plurality of photoresist structures on the substrate, each having a bottom surface attached to the substrate and a top surface opposite the bottom surface, the top surface having a dimension greater than a dimension of the bottom surface, at least one organic element positioned over the first electrode layer, and a second electrode layer positioned over the at least one organic element and the photoresist structures.

In one embodiment, the device further comprises an anode injection or hole transport layer positioned between the first electrode and the at least one organic element. In one embodiment, the photoresist structures have a dimension W1 in a range of 1 µm to 1000 µm and a dimension W2 in a range of 1 µm to 500 µm. In one embodiment, the photoresist structures have a dimension H1 in a range of 1 µm to 1000 µm. In one embodiment, the photoresist structures have a pitch W3 in a range of 5 µm to 1000 µm. In one embodiment, the first electrode layer is an anode and the second electrode layer is a cathode. In one embodiment, the first electrode layer is a cathode and the second electrode layer is an anode. In one embodiment, the photoresist structures have a shape of inverted pyramids. In one embodiment, the first electrode layer is directly electrically connected to all the organic elements. In one embodiment, the second electrode layer is directly electrically connected to all the organic elements.

In one embodiment, the device is incorporated into a product selected from the group consisting of an OLED display, a LED display, a micro-LED and LCD display, a virtual reality display, an eyewear display, a headset display, a flat panel display, a computer monitor, a 3D display, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

In another aspect, a method for fabricating an organic electronic component, comprises providing a plurality of photoresist structures on a substrate, spaced apart so as to define a plurality of cavities between the photoresist structures, the substrate having a first electrode layer, the photoresist structures having a bottom surface attached to the substrate and a top surface opposite the bottom surface, the top surface having a dimension greater than a dimension of the bottom surface, providing a mask having a plurality of openings over the top surface of the photoresist structures, the plurality of openings aligned with the plurality of cavities, depositing a quantity of organic material over the substrate through a first opening of the plurality of openings, moving the mask so that the first opening aligns with a different cavity of the plurality of cavities, and depositing a second quantity of organic material over the substrate through the first opening, wherein the first opening has a dimension that is larger than a distance between adjacent top edges of first and second photoresist structures.

BRIEF DESCRIPTION OF THE DRAWINGS

The foregoing purposes and features, as well as other purposes and features, will become apparent with reference to the description and accompanying figures below, which are included to provide an understanding of the disclosure and constitute a part of the specification, in which like numerals represent like elements, and in which.

DETAILED DESCRIPTION

Figure 1:
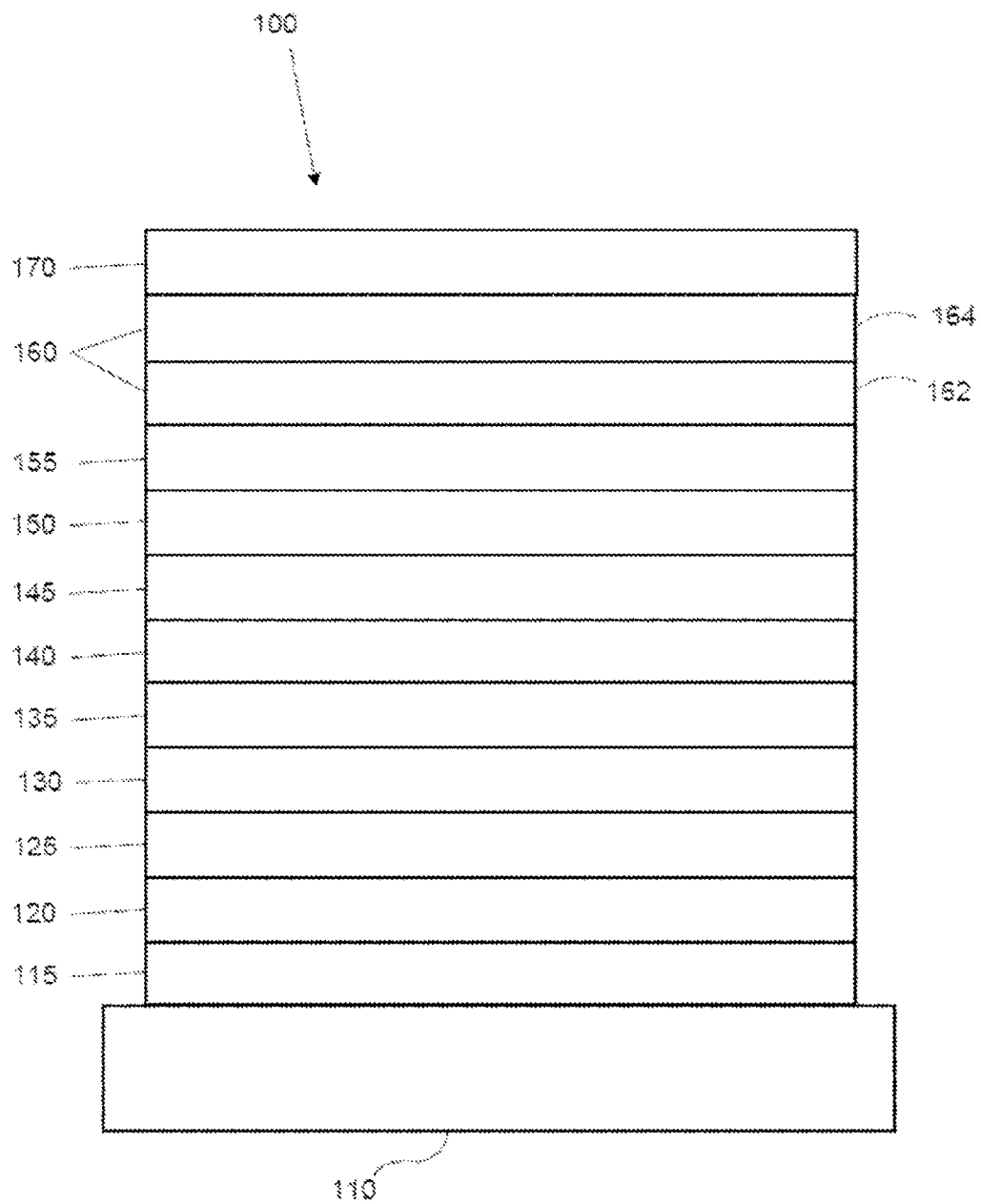
FIG. 1 is an exemplary OLED device.

It is to be understood that the figures and descriptions of the present disclosure have been simplified to illustrate elements that are relevant for a clear understanding of the present disclosure, while eliminating, for the purpose of clarity, many other elements found in related systems and methods. Those of ordinary skill in the art may recognize that other elements and/or steps are desirable and/or required in implementing the present disclosure. However, because such elements and steps are well known in the art, and because they do not facilitate a better understanding of the present disclosure, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this disclosure belongs. Although any methods and materials similar or equivalent to those described herein can be used in the practice or testing of the present disclosure, exemplary methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Throughout this disclosure, various aspects can be presented in a range format. It should be understood that the description in range format is merely for convenience and brevity and should not be construed as an inflexible limitation on the scope of the disclosure. Accordingly, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, 6 and any whole and partial increments therebetween. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
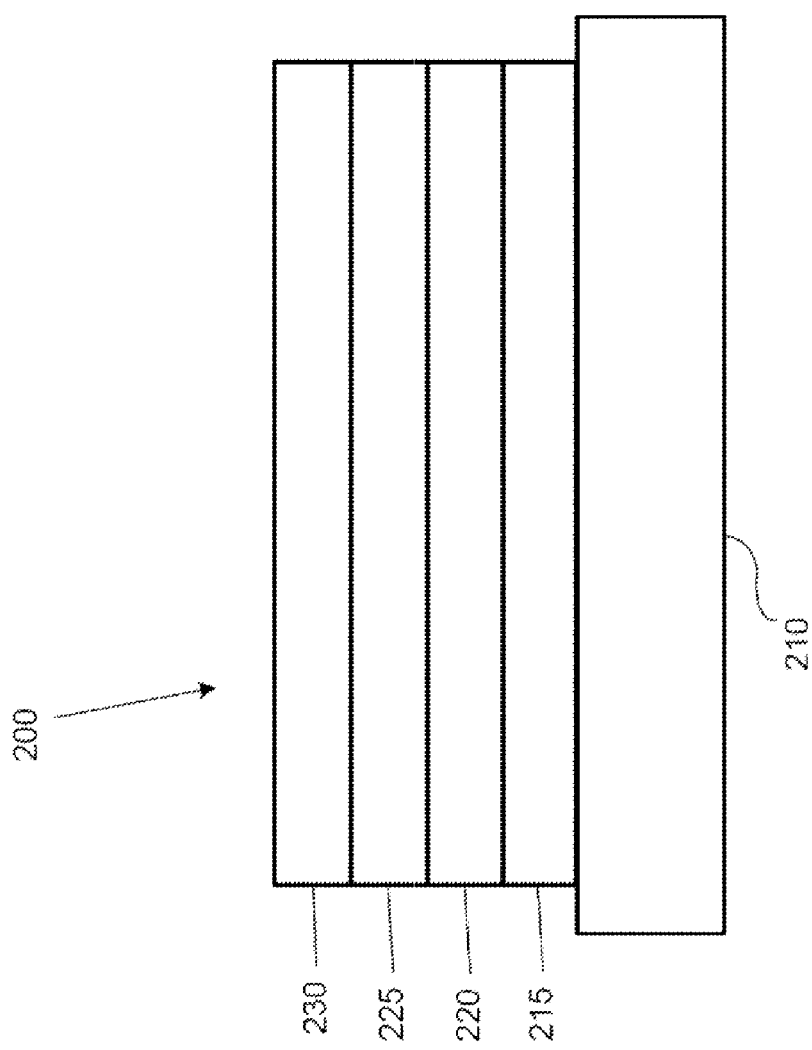
FIG. 2 is an exemplary OLED device.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the disclosure may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present disclosure may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the disclosure can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the disclosure can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, curved displays, computer monitors, medical monitors, televisions, billboards, lights for interior or exterior illumination and/or signaling, heads-up displays, fully or partially transparent displays, flexible displays, rollable displays, foldable displays, stretchable displays, laser printers, telephones, mobile phones, tablets, phablets, personal digital assistants (PDAs), wearable devices, laptop computers, digital cameras, camcorders, viewfinders, micro-displays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present disclosure, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

Although exemplary embodiments described herein may be presented as methods for producing particular circuits or devices, for example OLEDs, it is understood that the materials and structures described herein may have applications in devices other than OLEDs. For example, other optoelectronic devices such as organic solar cells and organic photodetectors may employ the materials and structures. More generally, organic devices, such as organic transistors, or other organic electronic circuits or components, may employ the materials and structures.

In some embodiments, the OLED has one or more characteristics selected from the group consisting of being flexible, being rollable, being foldable, being stretchable, and being curved.

In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence; see, e.g., U.S. application Ser. No. 15/700,352, which is hereby incorporated by reference in its entirety), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

One aspect of the disclosure improves upon one or more techniques based on a re-entrant shadow mask disclosed in U.S. Pat. No. 6,013,538 issued on Jan. 11, 2000 to Burrows et al., the contents of which is incorporated herein by reference in its entirety.

Figure 3:
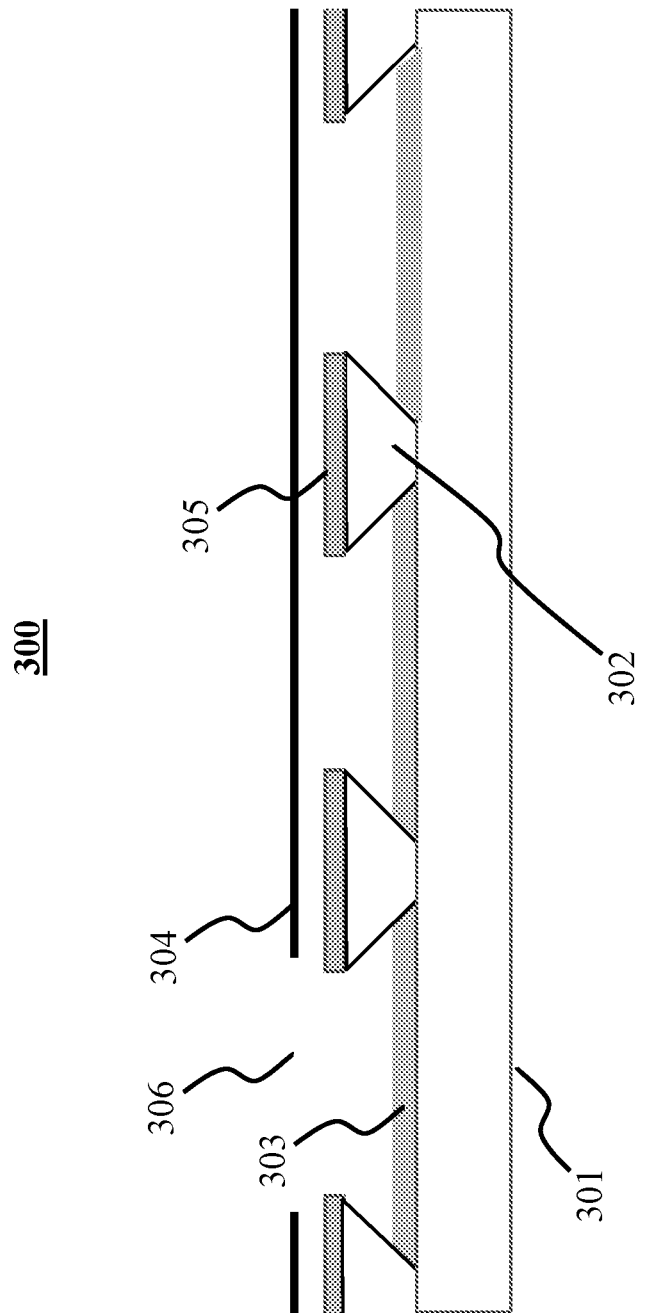
FIG. 3 is a diagram of a display fabrication system.

With reference now to FIG. 3, one configuration of a device of the disclosure is shown. Device 300 includes substrate 301 which in some embodiments includes an electrode pattern, which may be an anode or a cathode. In one embodiment, substrate 301 includes an indium tin oxide (ITO) patterned anode. Substrate 301 also includes a set of double-layer photoresist structures 302 positioned on the surface. Between and surrounding the structures 302 on the surface of substrate 301 may be positioned in some configurations, layer 303, which may be for example a hole transport layer or other common anode layers. In some embodiments, layer 303 comprises an electron transport layer or other common cathode layers. Device 300 may in some embodiments further include one or more shadow masks 304 positioned over the photoresist structures 302, the shadow masks having one or more openings 306 through which material may be deposited over the substrate 301. Deposition residue 305 may accumulate on the tops of structures 302.

Figure 4:
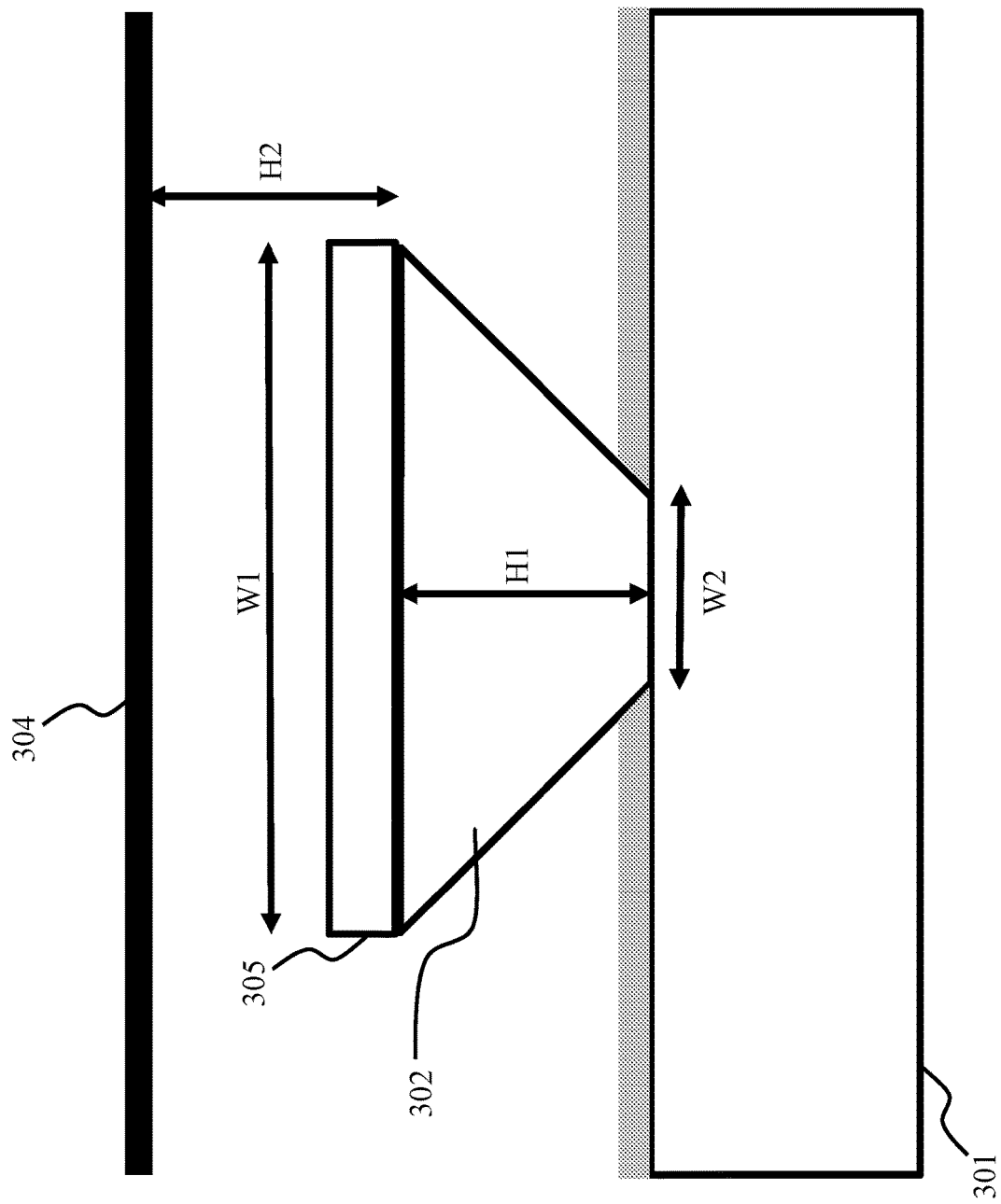
FIG. 4 is a diagram of a feature of a display fabrication system.

Aspects of the configuration may be better understood with reference to FIG. 4, which shows a detail view of an exemplary photoresist structure 302 on substrate 301, with mask 304 suspended overhead. The structure 302 and its position relative to mask 304 may be defined by dimensions H1, H2, W1, and W2, where H1 is the height from the substrate 301 to the top of the structure 302, H2, is the height from the top of the structure 302 to the opposite face of mask 304, W1 is the width of the structure 302 measured at the top of the structure, and W2 is the width of the structure 302 measured at the bottom of the structure.

Figure 5:
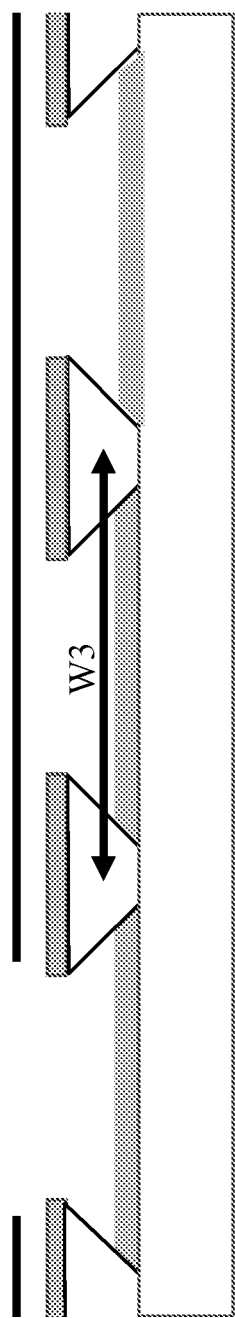
FIG. 5 is a diagram of a display fabrication system.

In some embodiments, W1 is in a range from 1 μm to 1000 μm, or from 5 μm to 500 μm, or from 10 μm to 100 μm. W2 may be in a range from 1 μm to 500 μm, or from 5 μm to 200 μm, or from 10 μm to 50 μm. H1 may be in a range from 1 μm to 1000 μm, H2 is in a range from 0 μm to 500 μm, or from 5 μm to 250 μm, or from 10 μm to 100 μm. In some embodiments, the distance H2 between the mask 304 and the photoresist structure 302 may vary based on the mass pattern, pixel resolution, and/or shape of the photoresist structure. With reference now to FIG. 5, the structures may be positioned at a pitch W3 (defined as the distance in one axis from the center of one structure to the center of an adjacent structure) having a range from 5 μm to 1000 μm, or from 5 μm to 200 μm, or from 5 μm to 50 μm, or from 5 μm to 10 μm. In some embodiments, some or all of the dimensions W1, W2, W3 may be the same in the X and Y axes (e.g.

where the structures are evenly-spaced inverted pyramids with a square base) but in other embodiments, some or all of the dimensions W1, W2, and W3 may differ in one axis versus the other, for example where the structures are inverted pyramids with a rectangular base. In some embodiments, W1 on one axis may be between 10% and 90% of W1 on the other axis. In some embodiments, W2 on one axis may be between 10% and 90% of W2 on the other axis. In some embodiments, W3 on one axis may be between 10% and 90% of W3 on the other axis. In some embodiments, one or more dimensions may vary between different structures due to manufacturing processes by as much as 1%, 2%, 5%, 10%, or 20%.

Although the depicted examples depict the structures 302 as inverted pyramids, it is understood that in some embodiments, structures may have other shapes, including inverted cones, inverted hemispheres, cubes, rectangular prisms, or the like. In some embodiments, structures may comprise an overhang, for example a right angle or obtuse angle overhang. In some embodiments, the pattern may comprise stripes spanning some or all of one dimension of the device, and in some embodiments there is no undercut along the long axis. In one such embodiment, the pattern may be incorporated into a lighting fixture.

Mask 304 may be made from any suitable material, including but not limited to Mo, Cu, phosphor-bronze, stainless steel, plastic, glass sheets, or any other suitable material, and may have a thickness in a range of 20 μm or more. Suitable masks may have a thickness between 20 μm and 5000 μm, or between 50 μm and 1000 μm, or between 100 μm and 500 μm. The openings 306 may have any suitable shape, including but not limited to square, circular, rectangular, or any other suitable shape, and may have major and minor dimensions in a range from 0.1 μm to 100 μm or larger. In one embodiment, an opening 306 has a major and/or minor dimension equal to W3-W1.

In some embodiments, one or more masks may be configured to be moved using, for example, a precision controlled mechanism that holds the mask along one or more edges, and along one, two, or three axes. In some embodiments, multiple masks may be placed sequentially on or above a substrate surface using alignment marks, physical alignment fixtures such as pins or rails, or by any other suitable means.

Figure 6:
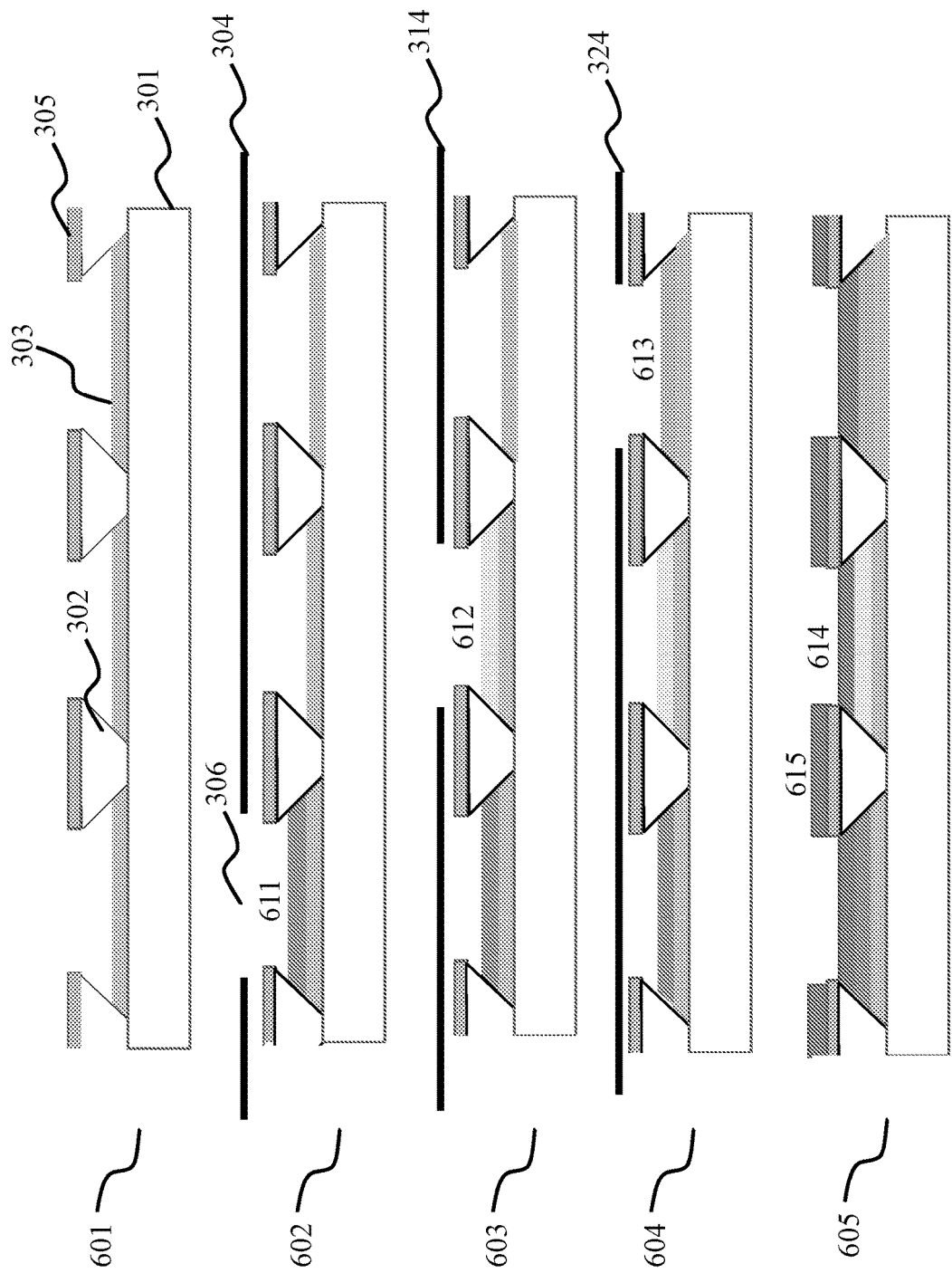
FIG. 6 is a diagram of a method of fabricating a display.

Another aspect of the disclosure relates to a method of fabricating an OLED display, specifically a method of patterning side-by-side color emissive elements on a substrate. An illustration of an exemplary method of the disclosure is shown in FIG. 6. As used herein, the terms "emissive element" and "emissive layer" may be used interchangeably, where an emissive element may refer to a quantity of an emissive material deposited or otherwise positioned on a substrate in order to form an emissive layer of the emissive material positioned between two electrode layers, configured to emit one or more wavelengths of light when current is applied. An emissive element or emissive layer as contemplated herein may comprise one or more distinct emissive materials, or may alternatively comprise one or more emissive and non-emissive materials in combination.

With reference to FIG. 6, in first step 601, a substrate 301 with pre-patterned anode contacts (e.g. ITO) is prepared with inverted photoresist (PR) pyramids 302 using bilayer or other PR processes. All layers forming the anode injection and hole transport functions 303 are then blanket deposited over the substrate surface in a single step. Residue from this deposition 305 will form on the tops of the inverted pyramids 302.

In second step 602, a modest (not fine) metal mask 304 is positioned over one in every three pixels. In some embodiments, the mask 304 may be positioned over one in every two pixels, on in every four pixels, one in every six pixels, one in every eight pixels, one in every nine pixels, or any other suitable ratio of the pixels as dictated by the characteristics of the display device. The red emissive layer (R EML) 611 is deposited through the openings 306 in the mask 304. One advantage of a disclosed design is that by using the photoresist structures in conjunction with a mask for deposition, the openings in the mask need not be the size of the desired feature to be deposited. Rather, the openings need only be smaller than the pitch of the photoresist structures. This allows for the use of cheaper masks to perform higher-resolution deposition.

In a third step 603, a second mask 314 is positioned over the regions used for green pixels and the green (G) EML 612 is deposited through the openings in the mask. Note the same mask as used for the R pixels (304) can be simply translated from the R to the G regions if the size and number of G and R pixels is the same (which is not always the case).

In a fourth step 604, step 603 is repeated, but now the mask openings are positioned over the blue (B) pixels and the B EML 613 is deposited. The same or a different mask can be employed for G and B pixels with the same considerations as in step 603. The order of deposition of R to G to B can be altered if it is convenient in reusing the same mask. For manufacturing displays having more than three subpixels, step 603 may be repeated for each additional subpixel beyond three.

In a fifth step 605, the cathode layers 614, cathode metal, and if desired an encapsulation layer(s) are deposited. Residue 615 from this deposition will accumulate on the surface of the inverted pyramids 302 although this will not interfere with the pixel quality as long as the PR thickness is greater than the total thickness of the pixels.

In some embodiments, where a common cathode is desired, the height H1 of the structures can be approximately equal to the total thickness of the anode+EML+electron injection/transport layers such that the cathode metal and encapsulation will short out (i.e. be directly electrically connected to) all pixel cathodes. In some embodiments, if residues are not desired, an "inverse" shadow mask pattern can be employed and the underlying, exposed pyramids can be cleaned by oxygen or other plasma. In some embodiments, the cathode and anode positions can be switched. In some embodiments, top emission can be used in place of bottom emission by reversing the position of the transparent contact. Total device transparency can be obtained in some embodiments by using both transparent cathode and anode contacts.

Although various methods and devices are described herein as related to multi-color OLED displays and the fabrication thereof, it is understood that the devices and methods may alternatively be used in patterning all types of organic electronic devices, including but not limited to lasers, photodetectors, solar cells, while OLEDs, and transistors.

The disclosures of each and every patent, patent application, and publication cited herein are hereby incorporated herein by reference in their entirety. While this disclosure has been presented with reference to specific embodiments, it is apparent that other embodiments and variations of this disclosure may be devised by others skilled in the art without departing from the true spirit and scope of the disclosure. The appended claims are intended to be construed to include all such embodiments and equivalent variations.

What is claimed is:

1. An organic electronic device, comprising:
   a substrate;
   a first electrode layer positioned over the substrate;
   a plurality of photoresist structures over the substrate, each having a bottom surface and a top surface opposite the bottom surface, the top surface having a dimension greater than a dimension of the bottom surface, wherein the photoresist structures have a shape of inverted pyramids;
   at least one organic element positioned over the first electrode layer; and
   a second electrode layer positioned over the at least one organic element and the photoresist structures.

2. The device of claim 1, further comprising an anode injection or hole transport layer positioned between the first electrode and the at least one organic element.

3. The device of claim 1, wherein the photoresist structures have a dimension W1 in a range of 1 μm to 1000 μm and a dimension W2 in a range of 1 μm to 500 μm.

4. The device of claim 1, wherein the photoresist structures have a dimension H1 in a range of 1 μm to 1000 μm.

5. The device of claim 1, wherein the photoresist structures have a pitch W3 in a range of 5 μm to 1000 μm.

6. The device of claim 1, wherein the first electrode layer or the second electrode layer is directly electrically connected to all the organic elements.

7. The device of claim 1, wherein the device is incorporated into a product selected from the group consisting of an OLED display, a LED display, a micro-LED and LCD display, a virtual reality display, an eyewear display, a headset display, a flat panel display, a computer monitor, a 3D display, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

8. An organic electronic device, comprising:
   a substrate;
   a first electrode layer positioned over the substrate;
   a photoresist layer positioned over the substrate, comprising a plurality of discrete photoresist structures, each having a bottom surface and a top surface opposite the bottom surface, the top surface of each photoresist structure having a dimension greater than a dimension of the bottom surface of each photoresist structure, and a plurality of openings between the plurality of photoresist structures, wherein the photoresist structures have a shape of inverted pyramids;
   at least one organic element positioned over the first electrode layer;
   a second electrode layer positioned over the at least one organic element and the photoresist layer; and
   wherein a first subset of the plurality of openings includes a first material, and a second subset of the plurality of openings includes a second material having a different composition than the first material.

9. The device of claim 8, wherein the first material is an emissive material configured to emit a first color, and the second material is an emissive material is configured to emit a second color.

10. The device of claim 9, wherein the second color is different from the first color.

11. The device of claim 9, wherein a third subset of the plurality of openings includes a third emissive material.

12. The device of claim 11, wherein the third emissive material is different from the first and second emissive materials.

13. The device of claim 11, wherein the third emissive material is configured to emit a third color.

14. The device of claim 13, wherein the third color is different from the first and second colors.

15. The device of claim 14, wherein the first color is red, the second color is green, and the third color is blue.

16. The device of claim 8, wherein the photoresist structures have a dimension W1 in a range of 1 μm to 1000 μm, a dimension W2 in a range of 1 μm to 500 μm, a dimension H1 in a range of 1 μm to 1000 μm, and a pitch W3 in a range of 5 μm to 1000 μm.

17. The device of claim 8, wherein the device is incorporated into a product selected from the group consisting of an OLED display, a LED display, a micro-LED and LCD display, a virtual reality display, an eyewear display, a headset display, a flat panel display, a computer monitor, a 3D display, a medical monitor, a television, a billboard, a heads up display, a fully transparent display, a flexible display, a laser printer, a telephone, a cell phone, a personal digital assistant, a laptop computer, a digital camera, a camcorder, a viewfinder, an augmented reality display, a micro-display, a vehicle, a large area wall, a theater or stadium screen, and a sign.

* * * * *